(12) United States Patent
Reid et al.

(10) Patent No.: US 7,106,778 B2
(45) Date of Patent: Sep. 12, 2006

(54) TUNEABLE LASER

(75) Inventors: Douglas Charles John Reid, Rugby (GB); Andrew Cannon Carter, Blisworth (GB)

(73) Assignee: Bookham Technology, plc, Abington (GB)

( * ) Notice: Subject to any disclaimer, the term of this patent is extended or adjusted under 35 U.S.C. 154(b) by 7 days.

(21) Appl. No.: 10/472,624

(22) PCT Filed: Mar. 19, 2002

(86) PCT No.: PCT/GB02/01329

§ 371 (c)(1),
(2), (4) Date: Mar. 23, 2004

(87) PCT Pub. No.: WO02/075867

PCT Pub. Date: Sep. 26, 2002

(65) Prior Publication Data

US 2004/0151215 A1 Aug. 5, 2004

(30) Foreign Application Priority Data

Mar. 19, 2001 (GB) ................................. 0106790.9
Jun. 19, 2001 (GB) ................................. 0114970.7

(51) Int. Cl.
*H01S 3/08* (2006.01)
(52) U.S. Cl. ....................... 372/96; 372/102; 372/98
(58) Field of Classification Search .............. 372/92, 372/69–98, 102
See application file for complete search history.

(56) References Cited

U.S. PATENT DOCUMENTS

| 4,847,856 A | * | 7/1989 | Sugimura et al. ............. 372/96 |
| 4,885,753 A | * | 12/1989 | Okai et al. ..................... 372/45 |
| 4,932,034 A | * | 6/1990 | Usami et al. .................. 372/96 |
| 5,088,097 A | * | 2/1992 | Ono et al. ..................... 372/20 |
| 5,091,916 A | | 2/1992 | Cimini, Jr. et al. |
| 5,187,717 A | * | 2/1993 | Horita et al. .................. 372/96 |
| 5,379,318 A | | 1/1995 | Weber ........................... 372/96 |
| 5,497,393 A | | 3/1996 | Lee |
| 5,642,371 A | * | 6/1997 | Tohyama et al. ......... 372/45.01 |
| 5,838,714 A | * | 11/1998 | Delorme ....................... 372/96 |
| 6,580,740 B1 | * | 6/2003 | Funabashi et al. ........ 372/50.22 |

FOREIGN PATENT DOCUMENTS

EP 0 559192 A 9/1993

OTHER PUBLICATIONS

Yuichi Tohmori et al. Broad-Range Wavelenght-Tunable Superstructure Grating, IEEE Journal Of Quantum Electronics, vol. 29(6) (Jun. 1, 1993).

* cited by examiner

*Primary Examiner*—Minsun Oh Harvey
*Assistant Examiner*—Phillip Nguyen
(74) *Attorney, Agent, or Firm*—Lahive & Cockfield, LLP; Anthony A. Laurentano, Esq.

(57) ABSTRACT

A tuneable laser having an active section, a phase section and a Bragg reflector comprising a plurality of discrete grating units, at least two of which gratings have a different pitch, wherein current is applicable to at least the grating having a longer pitch, such that the effective wavelength of the grating having a longer pitch can be tuned to the wavelength of the grating having a shorter pitch. A chirp grating can provide the difference in pitch.

19 Claims, 12 Drawing Sheets

TUNEABLE LASER

RELATED APPLICATIONS

This application is a 35 U.S.C. 371 national stage filing of International Application No. PCT/GB02/01329, filed 19 Mar. 2002, which claims priority to Great Britain Patent Application No. 0106790.9 filed on 19 Mar. 2001, and Great Britain Patent Application No. 0114970.7 filed on 19 Jun. 2001 in Great Britain. The contents of the aforementioned applications are hereby incorporated by reference.

FIELD OF THE INVENTION

This invention relates to a tuneable laser, in particular but not exclusively to a three section distributed Bragg reflector tuneable laser.

BACKGROUND OF THE INVENTION

Tuneable lasers are well known in the field of optical communications, particularly in connection with wavelength division multiplex telecommunication systems, which rely upon either being fed by stacks of individually wavelength distributed Bragg reflectors (DBR) lasers, which can be individually selected, or by a wide tuning range tuneable laser that can be electronically driven to provide the wavelength required. Limited tuning range tuneable lasers that rely upon thermal effects for tuning are also available.

In this specification the term "light" will be used in the sense that it is used in optical systems to mean not just visible light but also electromagnetic radiation having a wavelength between 1000 nanometers (nm) and 3000 nm.

U.S. Pat. No. 4,896,325 discloses a wavelength tuneable laser having sampled gratings at the front and rear of its gain region. The gratings produce slightly different reflection combs which provide feedback into the device. The gratings can be current tuned in wavelength with respect to each other. Co-incidence of a maximum from each of the front and rear gratings is referred to as a supermode. To switch the device between supermodes requires a small electrical current into one of the gratings to cause a different pair of maxima to co-incide in the manner of a vernier. By applying different electrical currents to the two gratings, continuous tuning within a supermode can be achieved. In practice, the reflection spectra of the known sampled grating structures have a sine squared envelope which limits the total optical bandwidth over which the laser can reliably operate as a single mode device.

In contrast to the Segmented Grating Distributed Bragg Reflector (SG-DBR) described above, a Phase Shift Grating Distributed Bragg Reflector (PSG-DBR) is disclosed in GB-A-2331135. This has a plurality of repeat grating units in which each grating unit comprises a series of adjacent gratings having the same pitch, which gratings are separated by a phase change of π radians, wherein the gratings have different lengths to provide a pre-determined reflection spectrum.

The known devices have Bragg gratings which bound both ends of the gain and phase regions of a four section tuneable laser, which produces a comb wavelength response. For a given set of drive currents to the front and rear grating sections there is simultaneous correspondence in reflection peak at only one wavelength, as a consequence of which the device lases at that wavelength. To change this wavelength a different current is applied to the front and rear gratings. Thus the front and rear gratings operate in a vernier mode, in which the wavelengths of correspondence determine a supermode wavelength. Although the known devices have generally been acceptable, they share a tendency to suffer from short wavelength losses, which in combination with the front grating tuning absorption reduces the output power of the laser.

U.S. Pat. No. 5,379,318 discloses a DBR laser with an extended tuning range. A plurality of discrete gratings are arranged on opposing sides of a gain section. One discrete grating on each side is tuned so that each exhibits a wavelength-specific reflectivity which co-incides with the other, and thus the gain section is caused to lase at that wavelength. Discrete gratings are however required on both sides of the gain region.

BRIEF DESCRIPTION OF THE INVENTION

The present invention seeks to provide a tuneable laser with a higher optical output power whilst having acceptable manufacturing costs.

By the present invention there is provided a tuneable laser having a phase change section bounded on one side by a Bragg reflector and on the other side by a gain section, the Bragg reflector reflecting at a plurality of wavelengths and being capable of having current passing selectively through discrete sections so that one or more portions of the Bragg reflector can be tuned together with a portion reflecting at a lower wavelength to reflect at that lower wavelength.

The Bragg reflector may be a chirp grating and may be formed in a material having a refractive index variable in response to the passage of current therethrough, there being a plurality of external electrodes along the length of the grating, with each electrode being selectively connectable to a power source.

According to a further aspect of the invention there is provided a tuneable laser having an active section, a phase section and a Bragg reflector comprising a plurality of discrete grating units, at least two of which gratings have a different pitch, wherein current is applicable to at least the grating having a longer pitch, such that the wavelength of the grating having the longer pitch can be tuned to the wavelength of the grating having a shorter pitch.

In use, current is applied to the grating unit having a longer pitch so that it is optically equivalent to the adjacent grating having a shorter pitch when the respective reflective maxima superpose, thereby providing the dominant wavelength at which the device can lase. This lasing wavelength can then also be current tuned in the known manner.

Preferably, the tuneable laser is provided with a simple partial reflecting front mirror. In a preferred embodiment, the reflector comprises a plurality of discrete grating units, each having a constant respective pitch corresponding to respective predetermined wavelengths, the grating pitch increasing with distance from the active section. Preferably each grating unit has an independently actuable electrode. Preferably a conventional switching circuit is provided to switch the current to the electrodes and grating units.

The tuneable laser of the invention has a number of advantages over the known designs, in particular minimising the short wavelength losses inherent in the four section DBR lasers of the prior art, thereby having higher power output by dispensing with the front Bragg reflector, absorption is minimised as there is no contribution to tuning induced absorption from the front Bragg reflector, which usually dominates absorption. Also the absorption losses due to tuning in the Bragg reflector may be less than in known SG-DBR lasers as the use of a shorter grating is facilitated.

BRIEF DESCRIPTION OF THE DRAWINGS

Exemplary embodiments of the invention will now be described with reference to the drawings which show.

DESCRIPTION OF THE INVENTION

The wavelengths of interest referred to above, for example the C-band wavelengths of 1530 to 1570 nm are the wavelengths of light in free space. When such light passes through a medium, of refractive index $n_{eff}$ the wavelength of the light changes. The actual wavelength of the light within that medium which will be referred to herein as $\lambda'$, is the wavelength $\lambda$ divided by the value for the refractive index $n_{eff}$. In other words $$\lambda' = \lambda/n_{eff}.$$

where $n_{eff}$ is the effective refractive index of the medium as seen by the propagating light.

It so happens that the glass (silica) fibres, which are commonly used in telecommunications systems, have low loss regions at about 1100 nm 1300 nm and 1500 nm. These regions are about 100 nm wide and consequently much work is done on producing lasers that produce light in the low loss regions. The same is true for the tuneable laser of the present invention. The specific examples of the invention are designed to work in the C-Band, but the invention could be used for other wavelengths if required and if new types of fibre optical cables become available.

Figure 1:
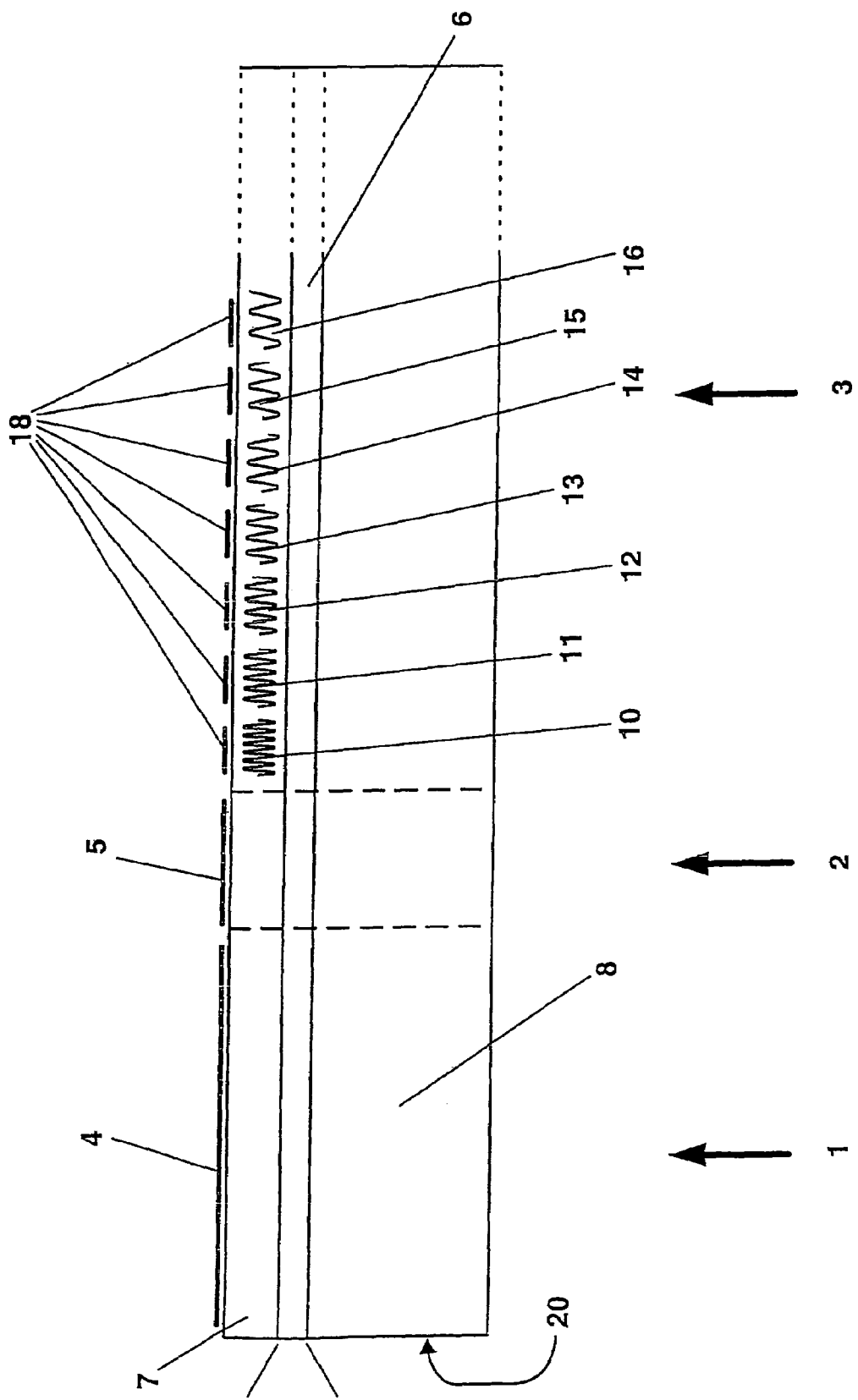
FIG. 1 shows a schematic representation of a three-section laser.

FIG. 1 shows a three section tuneable DBR semiconductor laser having an active or gain section 1, a phase section 2 and a rear mirror section 3. Both the gain section 1 and the phase section 2 are provided with electrodes 4, 5. At the boundary of the gain section 1, a front mirror 20 is provided, which mirror can be a simple partial reflecting mirror or other suitable mirror. The laser further comprises an active region 6, the Bragg reflector layer 7 and substrate layer 8.

The rear mirror section 3 has a plurality of discrete Bragg grating units 10–16 etched into the waveguide. The pitch of the respective grating units increases with distance from the active section, with the grating having the shortest pitch closest to the active section and the grating with the longest pitch furthest from the active section. Each of the gratings 10–16 has an associated electrode 18 which electrodes can be actuated independently of one another.

In use in, for example, a C-Band or L-Band 40 nm optical communication system, the difference in the wavelength between adjacent grating units 10–16 will typically be about 4 nm and the pitch of the respective grating unit 10–16 can be determined by the Bragg condition $$\lambda' = 2\Lambda$$

where $\lambda'$ is wavelength, and $\Lambda$ is the pitch for first order gratings, which are preferred as they provide the strongest coupling with no out coupling loss.

Figure 2:
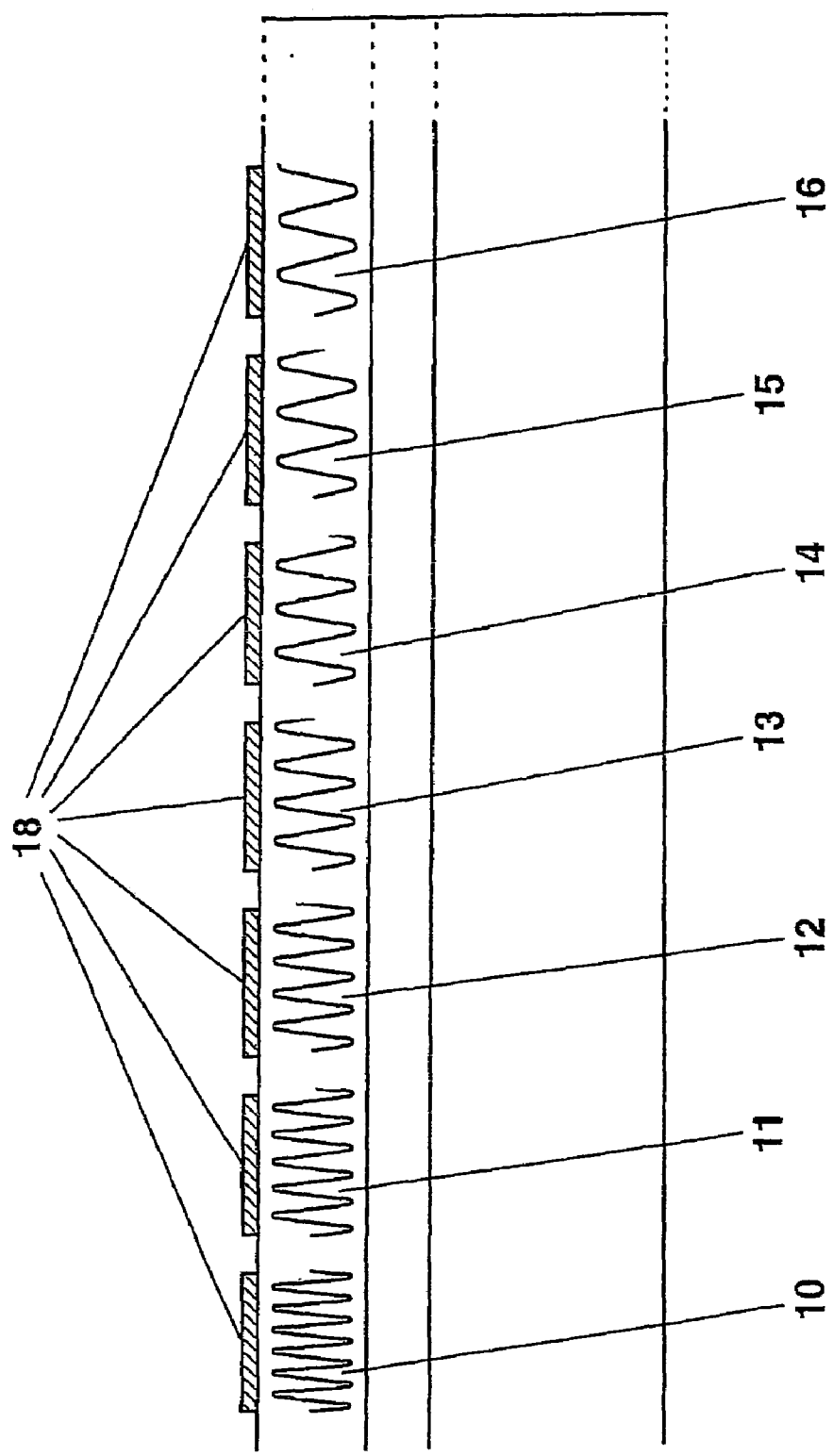
FIG. 2 shows a schematic representation of a Bragg reflector.

FIG. 2 shows a schematic representation of a Bragg reflector forming the rear mirror section 3. The Bragg reflector comprises a plurality of discrete grating units, in this case eleven for a 40 nm bandwidth, of which seven are illustrated, 10–16, each having a different pitch. The grating unit closest to the phase section 2 has the shortest pitch and the pitch of each successive grating unit remote from the phase section is greater than the pitch of the preceding unit. Each of the grating units 10–16 has an associated electrode 18, wherein each electrode can be actuated independently of one another. The Bragg grating can be fabricated using electron beam writing techniques or phase mask holographic techniques.

In use, the arrangement of grating units produces a reflection spectrum having a series of comparatively small maxima, which are typically closer together than in the prior art systems. If a current is applied to one of the grating units 10–16, the effective refractive index of the grating and the active material immediately underneath the electrode is decreased and hence the wavelength of the grating can be tuned. By appropriate tuning it is possible to tune one of the maxima corresponding to one of the grating units until it blends with the adjacent maximum of the grating having a shorter pitch to form a dominant wavelength, at which the device will start to lase. By successively tuning the maxima to blend with the corresponding shorter 'wavelength adjacent maxima' the laser can be tuned across a wide bandwidth. Typically, the grating pitches will be chosen so that the respective reflective peaks are separated by approximately half the maximum single peak tuning. e.g. 4 nm. Therefore, the first wavelength is tuned until it blends with the adjacent wavelength (second), lases and then this wavelength can be current tuned until it reaches the next grating wavelength (third), at which point the current to first grating is cut off, and wavelength tuning continues with current drive in the second and third grating units.

Figure 3A:
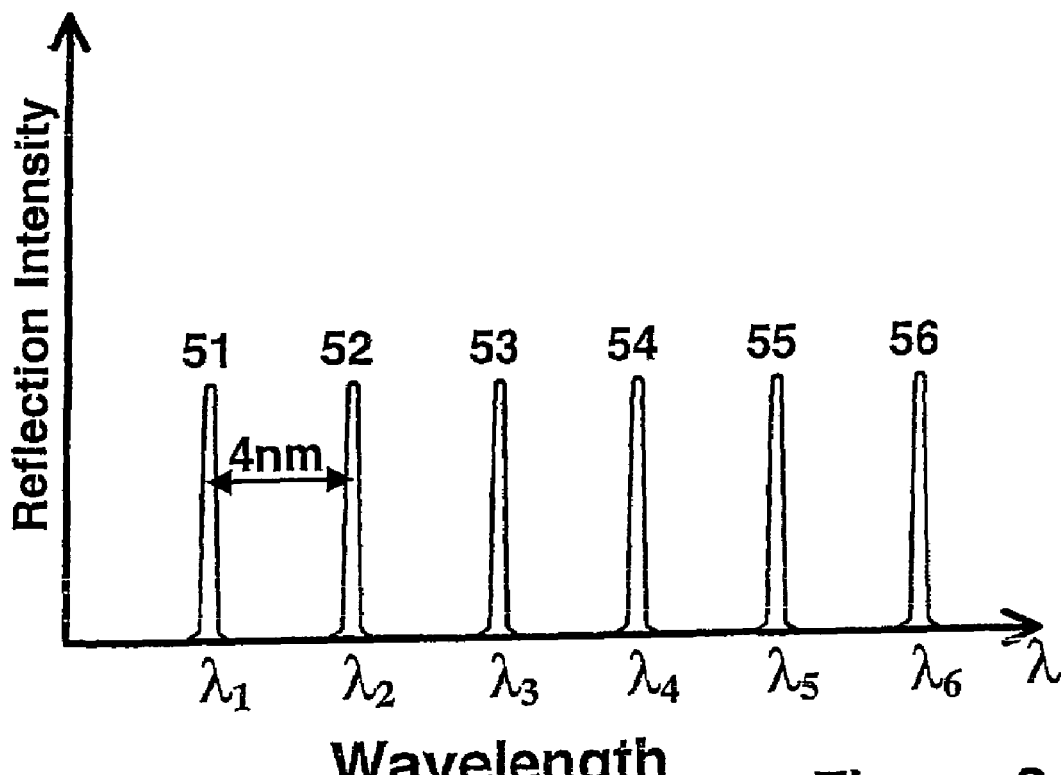
FIG. 3a shows a wavelength envelope using a known Bragg reflector.

FIG. 3a shows schematically part of the typical reflection spectrum obtained when no current is applied to the electrodes. The reflector has discrete reflective peaks shown which are of substantially similar intensities. These wavelength peaks are generally separated by about 4 nm for a C-Band or L-Band device.

Figure 3B:
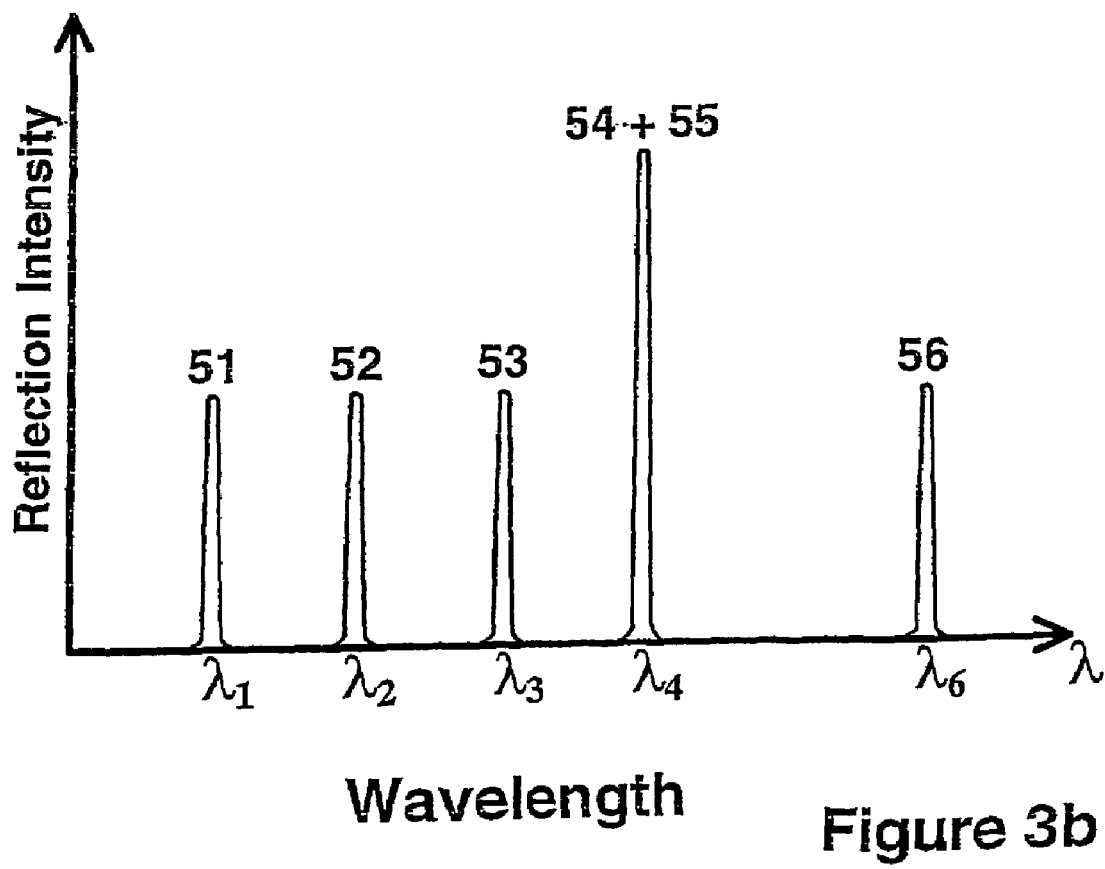
FIG. 3b shows a wavelength envelope using the Bragg reflector of the invention.

When current is applied to an electrode in the manner described in relation to FIG. 2 and so that one of the gratings, e.g. 55, is tuned, ultimately a spectrum is obtained as shown in FIG. 3b. In this case, the peak 54 has an intensity approximately double that of each of the peaks 51, 52, 53 and 56. It is at the wavelength peak 54 that the device will lase. By design the peaks will be substantially in phase when they blend together and thus reinforce however, it is possible that phasing effects generate features on the particular reflection maxima created which could be useful in particular applications such as to avoid mode hopping.

The laser cavity length will vary in dependence on the specific Bragg wavelength selected. In order to avoid mode hopping, and keep a constant optical cavity length, the phase section 2 is driven with current, see FIG. 1. It would, however, be possible to control the phase by selectively applying current to the electrodes located between the lowest grating used for wavelength selection and the gain section.

Although the front mirror is preferably a simple partial reflecting mirror, it can be any suitable mirror which will have the same reflection wavelength response as the rear mirror. Whilst a simple mirror will minimise losses, a Bragg grating could be used.

The invention design may be suitably applied to solid-state lasers manufactured using Group III–V or other semiconductor materials.

The photoluminescent gain curve of semiconductor materials is curved with intensity falloff at the edges of the spectrum. To produce a uniform intensity gain response across the bandwidth of interest the Bragg grating unit length can be varied to give enhanced reflectivity where required.

The reflectivity profile of the grating can be controlled such that the reflection peak has a sharp definition at the wavelength of interest thereby giving good side mode suppression. An example of such a grating is one that has along its length a partial or complete, or inverted Gaussian or Lorentzian reflectivity profile.

Figure 4:
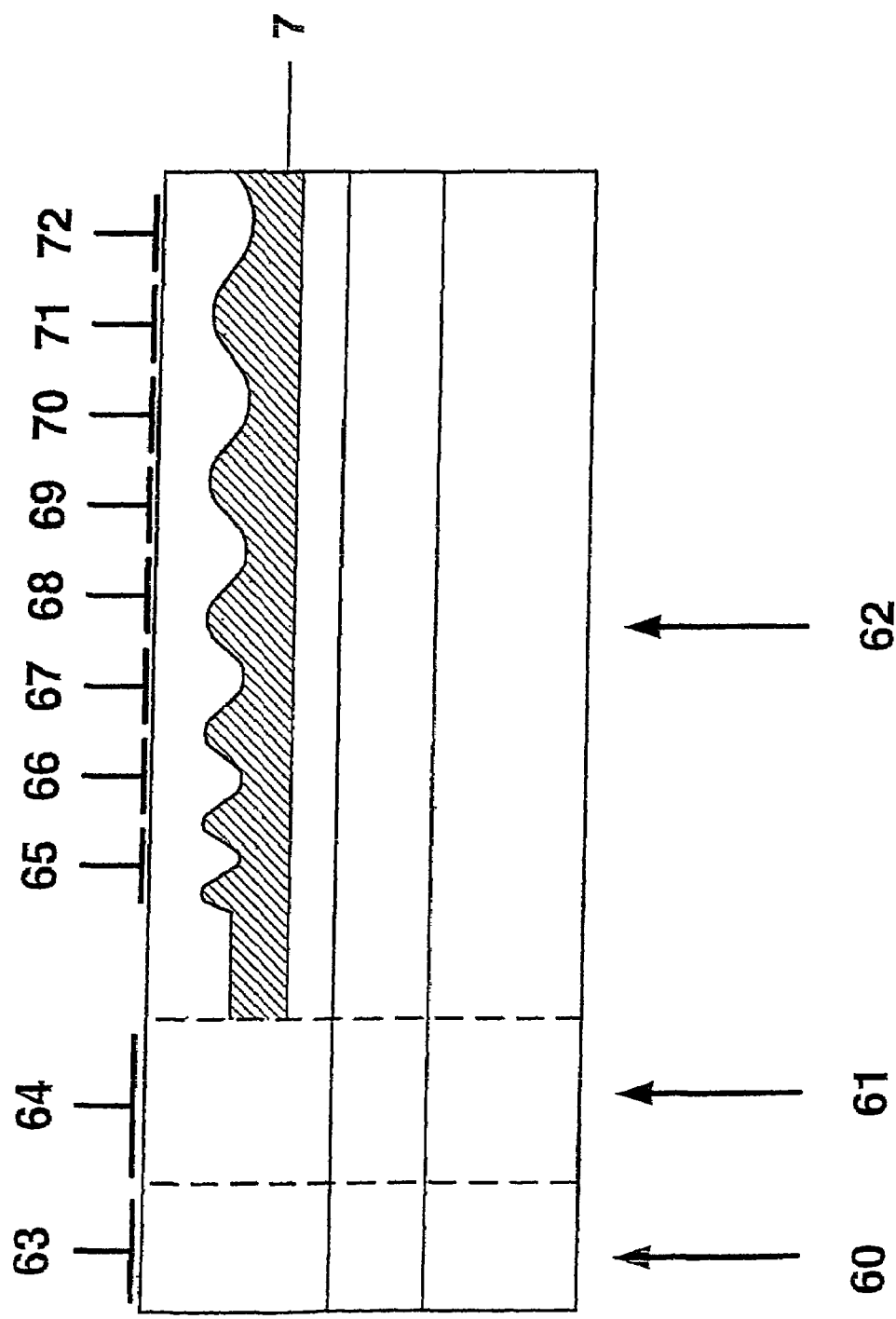
FIG. 4 shows a second embodiment of the invention

Referring to FIG. 4, this shows an alternative form of the invention in which the discrete Bragg gratings are replaced with a chirp grating. The laser assembly includes a gain section 60 a phase change section 61 and a chirp grating section 62. Located on the gain section is an electrode 63 to enable the passage of current into the gain section. Located on the phase change section is an electrode 64 to enable the passage of current into the phase change section and located on the chirp Bragg section is a series of individually selectable electrodes 65 to 72 to permit current to be passed selectively into portions of the chirp grating within section 62.

The chirp grating is a form of Bragg grating which has a substantially continuous variation in the wavelength at which it reflects light along its length. It is thus distinguished from a normal DBR which reflects at a single wavelength and also from a sampled grating DBR as shown in FIGS. 1 and 2, which reflects at a plurality of discrete wavelengths at different positions along its length.

A chirp grating is formed at the interface between two materials of different refractive index and can be represented graphically as a sinusoidal shaped waveform, or as a castellated form. The physical shape of the grating is dependant upon the etching technique employed and may result in a castellated form, particularly when a dry etching process is used to produce the grating, e.g. reactive ion etching.

The refractive index, n, of the material used in the production of the chirp grating through which the majority of the light passes is a quarternary material (InGaAsP) and the refractive index of the material varies with the wavelength of light passing through the material. Typically n at 1570 nm is 3.33, at 1550 nm n is 3.38 and at 1530 nm n is 3.43. Thus n decreases by about 3% from 1530 nm to 1570 nm.

An explanation of the construction and operation of the chirp grating is provided by FIGS. 4 to 12.

Figure 5:
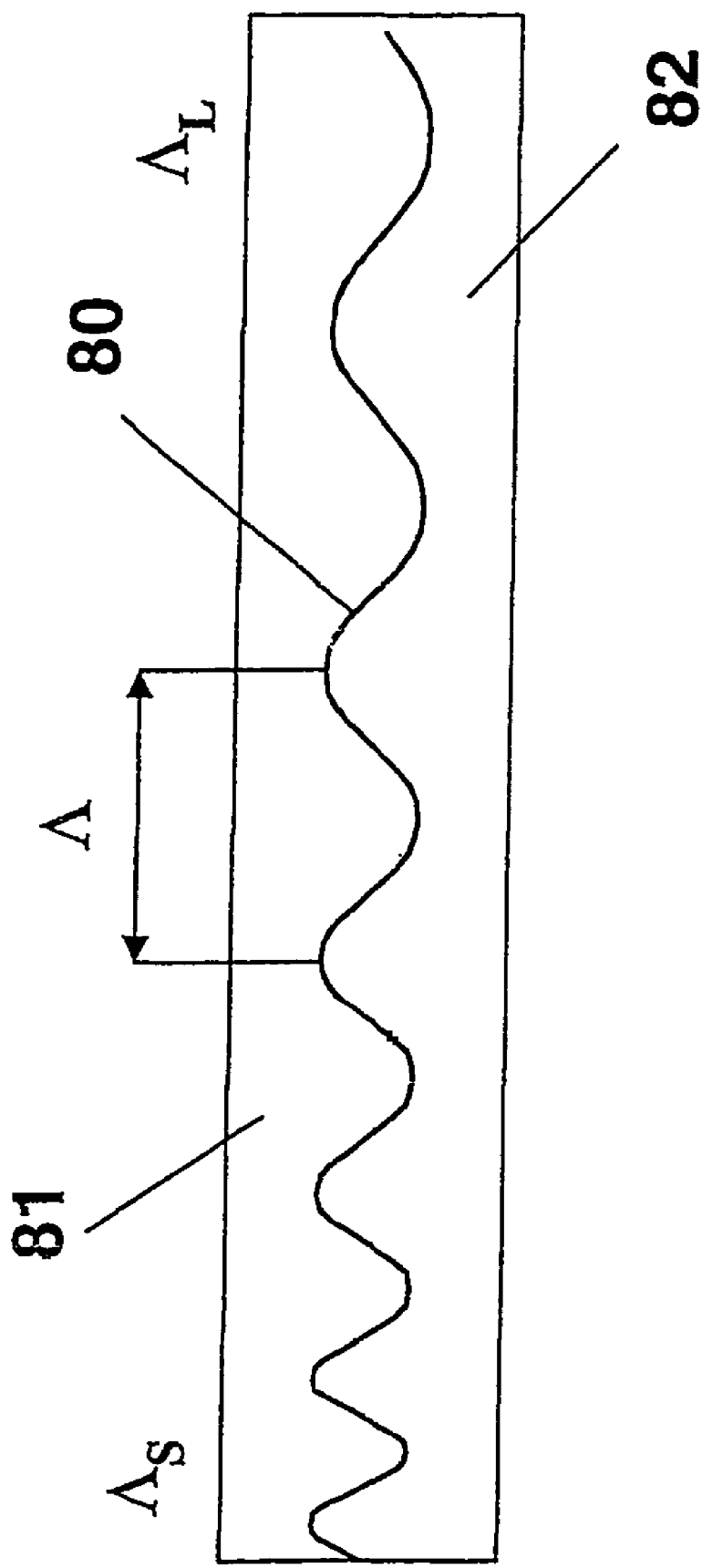
FIG. 5 shows a chirp grating

As shown in FIG. 5 the grating is formed as an interface 80 between the upper layer of material 81 of a low refractive index and a lower layer 82 of a higher refractive index. This Interface can be represented as a waveform and the pitch Λ of the waveform making up the grating is gradually increased along the length of the grating from $Λ_S$ at the short end of the chirp grating to $Λ_L$ at the long end of the grating. In FIG. 5 the increase in pitch is deliberately exaggerated to demonstrate what is happening. In practice the increase in pitch length over the whole of the grating is small, namely about 2.5%, so that at the short end the grating reflects light of a wavelength of about 1530 nm and at the long end the grating reflects light at a wavelength of 1570 nm. Thus there is a 40 nm variation in the reflection wavelength over the length of the grating, which is about 2.5% of the average wavelength of 1550 nm.

Figure 6:
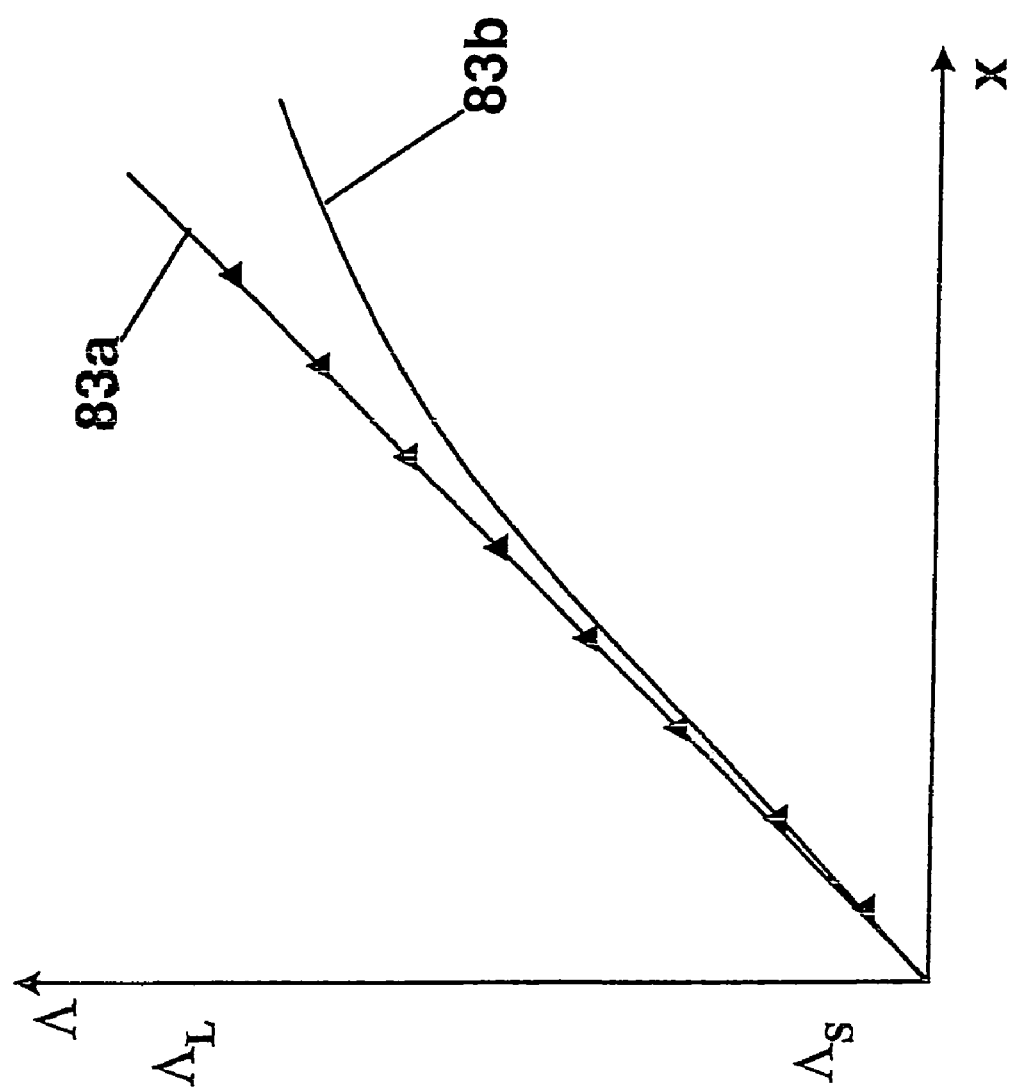
FIG. 6 shows a chirp line

In FIG. 6, there is a graph showing how the pitch of the grating varies along its length with the pitch Λ in the vertical axis and the length of the grating x on the horizontal axis.

It will be appreciated that the pitch values, Λ, along the length of the grating can be plotted directly against the length and a line is generated. The line can be straight or can be curved depending on how the pitch length is varied along the length of the grating. If the increase in grating pitch is at a constant rate the line is straight as shown at 83a, and the grating is called a linear chirp grating. If the increase in grating pitch along the grating is uniform, in other words in the direction of increasing Λ, each Λ is a certain small constant step increment on the one before it, then the line will not be linear but will curve downwards as shown at 83b, as the line increasingly goes to the right.

Figure 7:
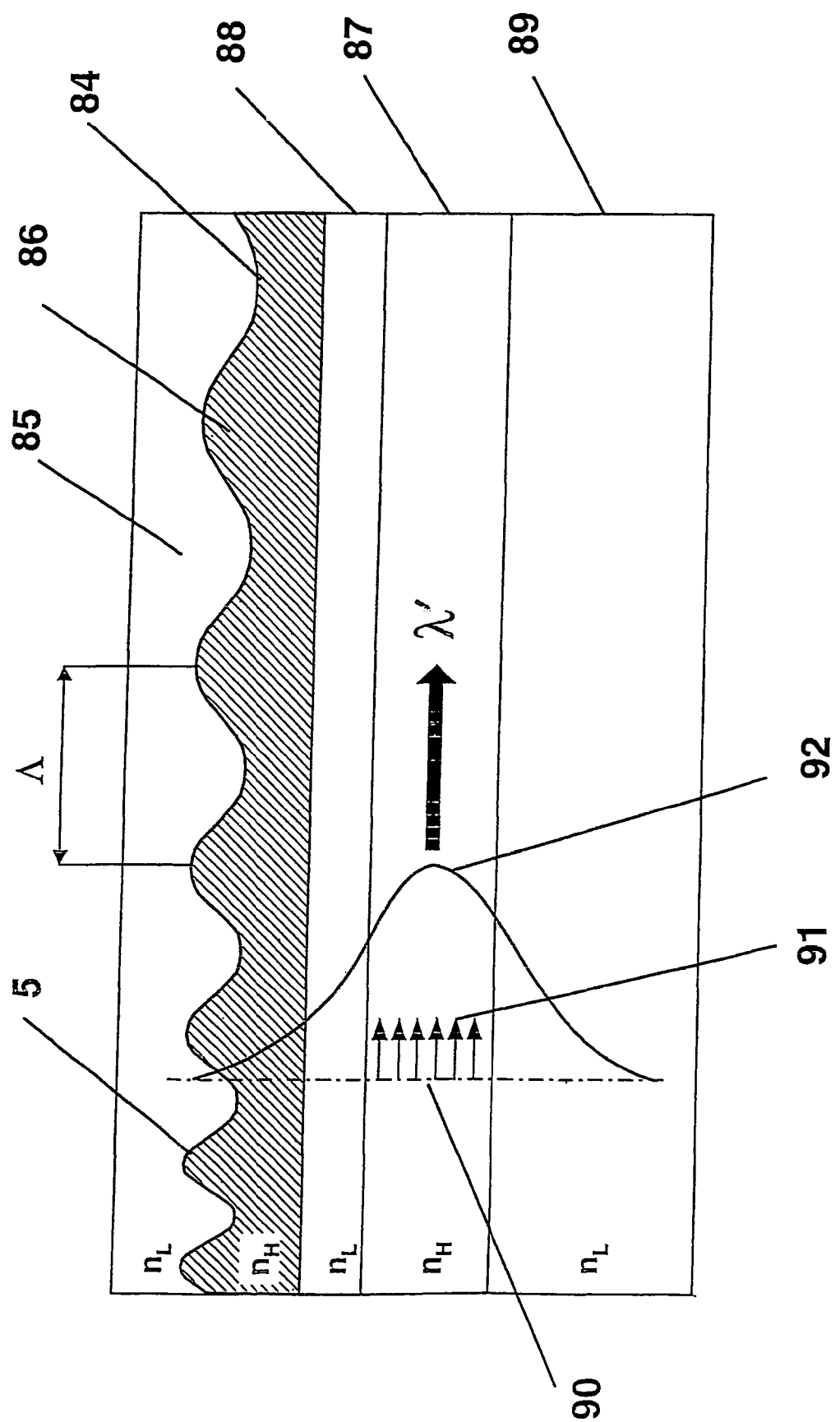
FIG. 7 shows an enlarged view of light passing down a chirp grating

Referring to FIG. 7, this demonstrates the effect of light passing along a chirp grating. Again the grating is shown as a sinusoidal interface 84 between an upper layer 85 of a lower refractive index and a lower layer 86 of higher refractive index. The waveguide of the assembly of high refractive index through which the majority of the light passes is shown at 87, separated from the lower layer 86 of the chirp grating by an intermediate layer 88 of low refractive index. Underneath the waveguide 8 is a further low refractive index substrate 89. Superimposed on the layer structure is a graphical representation of the wavefront of the light passing through from left to right as at 90 in the direction of the arrows 91. Line 92 is an indication of the intensity of the light in the layers of the assembly and it can be seen that most of the light passes through in the waveguide of high refractive index.

As shown in FIG. 7, the light passes not only through the waveguide but the evanescent wave also passes along the layer 86 forming the lower layer of the chirp grating. If the light should happen to have a wavelength λ' which is twice the length of a pitch Λ then that light will be reflected back i.e. if λ'=2Λ then that wavelength of light will be reflected. Thus the chirp grating as a whole will reflect light in the range $λ'_S=2Λ_S$ to $λ'_L=2Λ_L$ where $Λ_S$ is the shortest grating pitch and $Λ_L$ is the longest grating pitch. Light of wavelengths outside of this range will not be reflected back along the waveguide.

Figure 8:
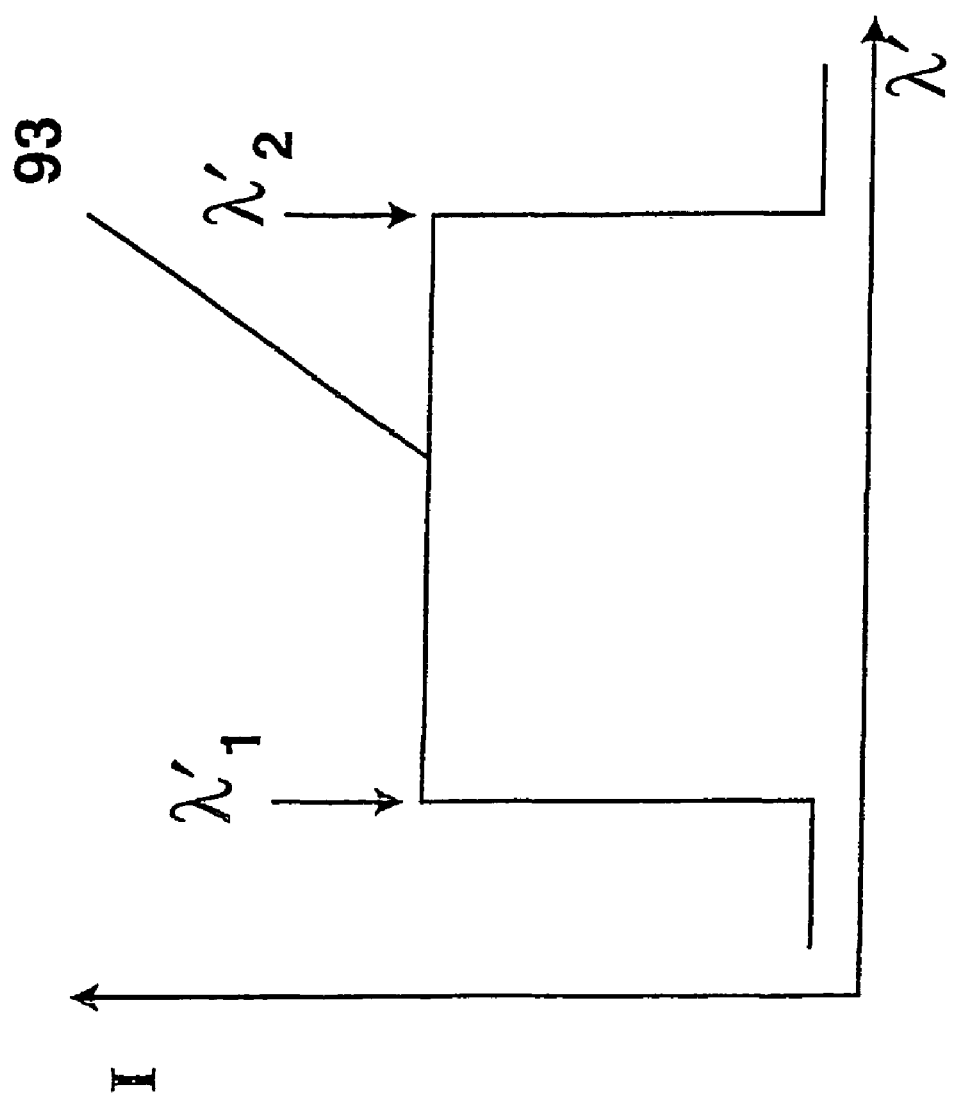
FIGS. 8 and 9 shows box diagrams of light intensity vs wavelength
Figure 9:
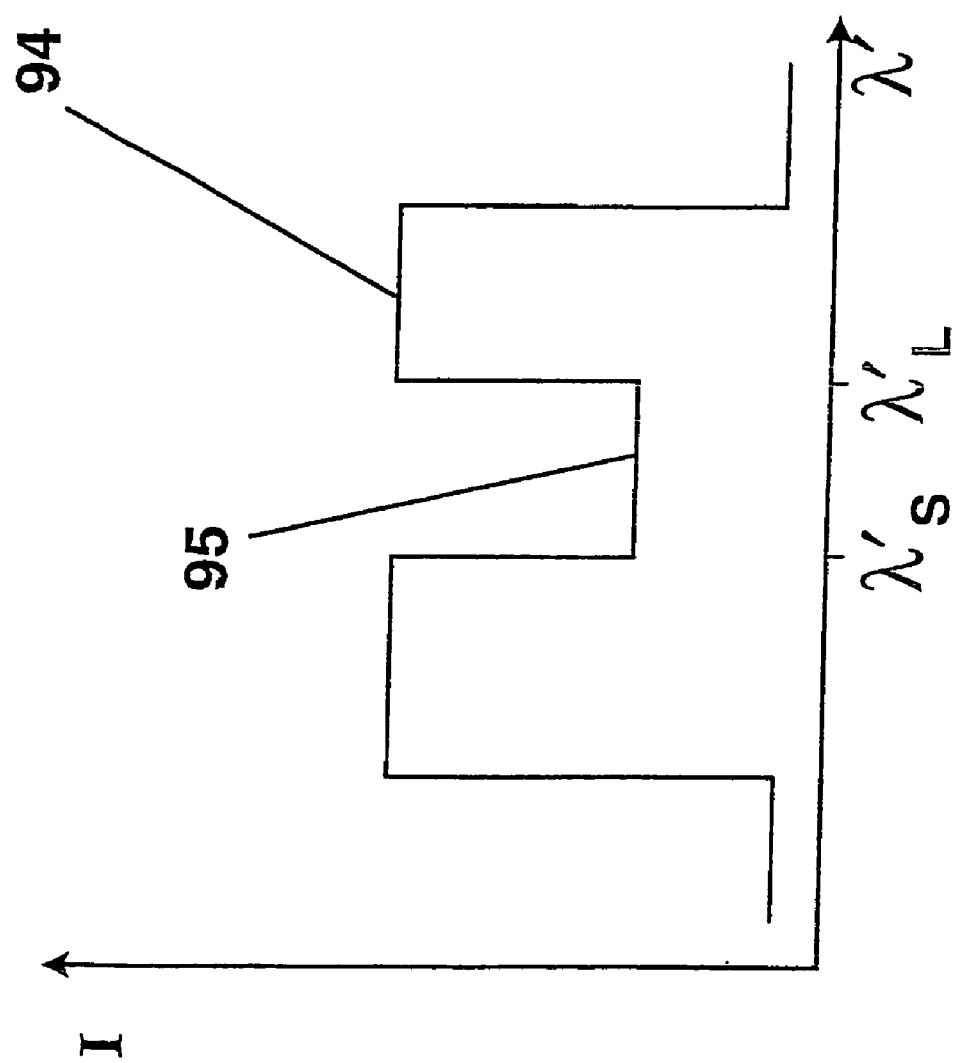

This can be represented diagrammatically as in FIGS. 8 and 9, which are box diagrams of intensity of light I in the vertical axis and wavelength λ' in the horizontal axis. If a box of light of plurality of wavelengths is admitted into the grating as shown at 93 in FIG. 8, the envelope is complete and represents all of the wavelengths between $λ'_1$ and $λ'_2$—which are widely separated wavelengths. However as the chirp grating reflects certain of the wavelengths, for example between $λ'_S$ and $λ'_L$ in FIG. 5, the emerging box of wavelengths 94 as shown in FIG. 9 has a gap 95 which corresponds to those wavelengths between $λ'_S$ and $λ'_L$ reflected by the chirp grating.

The chirp grating will, if in its complete and unaltered condition, reflect all wavelengths between $λ'_S$ and $λ'_L$ without any preference. However if one of the electrodes such as electrode 68 of FIG. 10, has a current passed through it, then that will lower the refractive index of the material in which the chirp grating is created. This will result in the grating as a whole being selectively enhanced in its reflectivity at this specific wavelength and this can result in the laser lasing at that wavelength.

This will be explained below in greater detail with reference to FIG. 10. In this figure the upper portion shows the laser of FIG. 4. This is positioned over the chirp diagram (as shown in FIG. 6) which in turn is positioned over a drawing of the reflectivity of the chirp grating vs distance.

Figure 10:
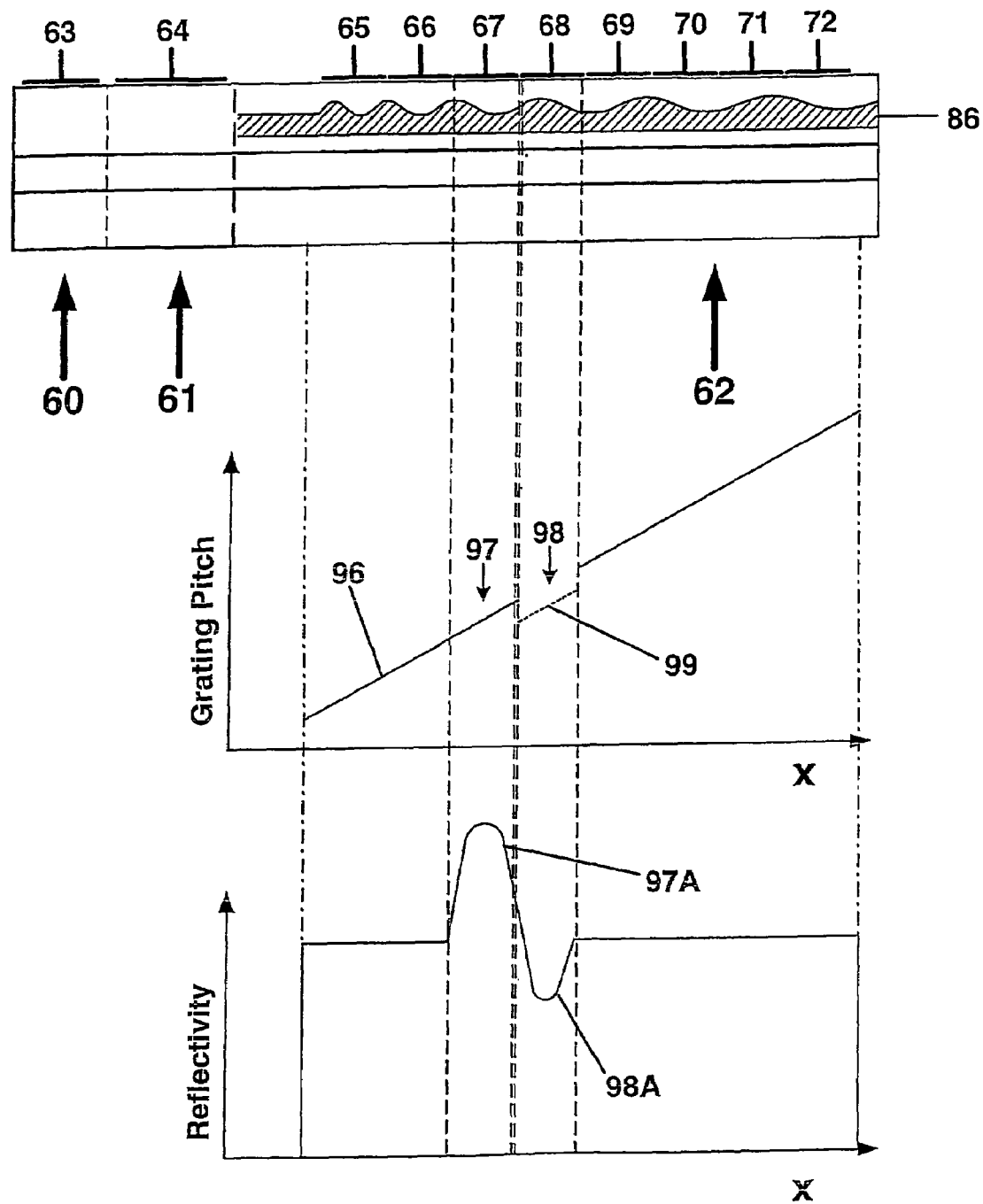
FIG. 10 is an explanatory view of a chirp laser chirp line and light intensity.

It can be seen in the central portion of FIG. 10, where the grating pitch Λ is plotted against distance x, that the chirp response line is shown by a line 96. It will be seen that line 96 has a region 98, shown dotted below the main portion of the line, for reasons which will be explained below.

On the outer surface of the laser there are a series of electrodes 63 to 72. The electrode 63 can be used to inject current into the gain section to make it create light. The electrode 64 can be used to control the phase section as described below and the electrodes 65 to 72 are able to inject current into different regions of the grating 62.

If just sufficient current is injected into the gain section to make it generate light, then if the chirp section is capable of reflecting light in the range of 1530 to 1570 nm the wavelengths of light within that range will be internally reflected. Light outside of the reflecting wavelengths will be absorbed or will be emitted from the ends of the laser. The laser will not lase because the intensity of the light at all of the frequencies in the range 1530 to 1570 nm is below the lasing threshold.

To get the laser to lase, it is necessary to have both a population inversion of charge carriers within the gain material and to get at least one, and preferably only one, wavelength to be above the lasing threshold. This is achieved by injecting sufficient current into the gain section 60 through electrode 63 to create the population inversion and by making a portion of the rear grating reflect light of a specific wavelength preferentially, so that the rear grating selectively reflects light of that particular wavelength. The front mirror will reflect back the light of that wavelength, so that that wavelength will become the preferred or enhanced wavelength and the laser will commence to lase at that wavelength.

The selection of the particular wavelength is effected by passing a current through an electrode such as electrode 68 above the portion of the chirp grating which corresponds to the region 98 in the chirp curve 96. The effect of the passage of current is to increase the current density in that region of the grating, which lowers the refractive index of the grating layer 86 just below the electrode 68. The lowering of the refractive index has the effect of making the grating reflect at a lower wavelength, which is the same effect as would be obtained by shortening the grating pitches in that region.

This means that the effective grating pitches of the dotted portion 99 as is shown in the central portion of FIG. 10 now line up with the adjacent region 97, forming a chirped Fabry-Perot étalon, which thus reinforces the reflection in the adjacent region 97.

Referring to the lowest portion of FIG. 10, which is a graph of reflectivity η vs. distance x, it can be seen that there is a trough 98A in the reflectivity of the grating which corresponds to the region 98 that now reflects at a lower wavelength. However there is now an enhancement of the reflectivity of the region 97 due to the resonant chirped Fabry-Perot étalon structure. Thus there is produced the reinforced peak 99A in the reflectivity.

Light at the wavelength that corresponds to the position of peak 99A is thus selectively reflected. The front mirror as it reflects at all wavelengths reflects the light at the selected wavelength, and the laser commences to lase at that wavelength.

It will be appreciated that without any further adjustments the laser could only be tuned to as many different wavelengths as there are electrodes 65 to 72.

However, the device can be made continuously tuneable if it is assumed that the materials from which the chirp gratings are constructed have a sufficiently variable refractive index.

Figure 11:
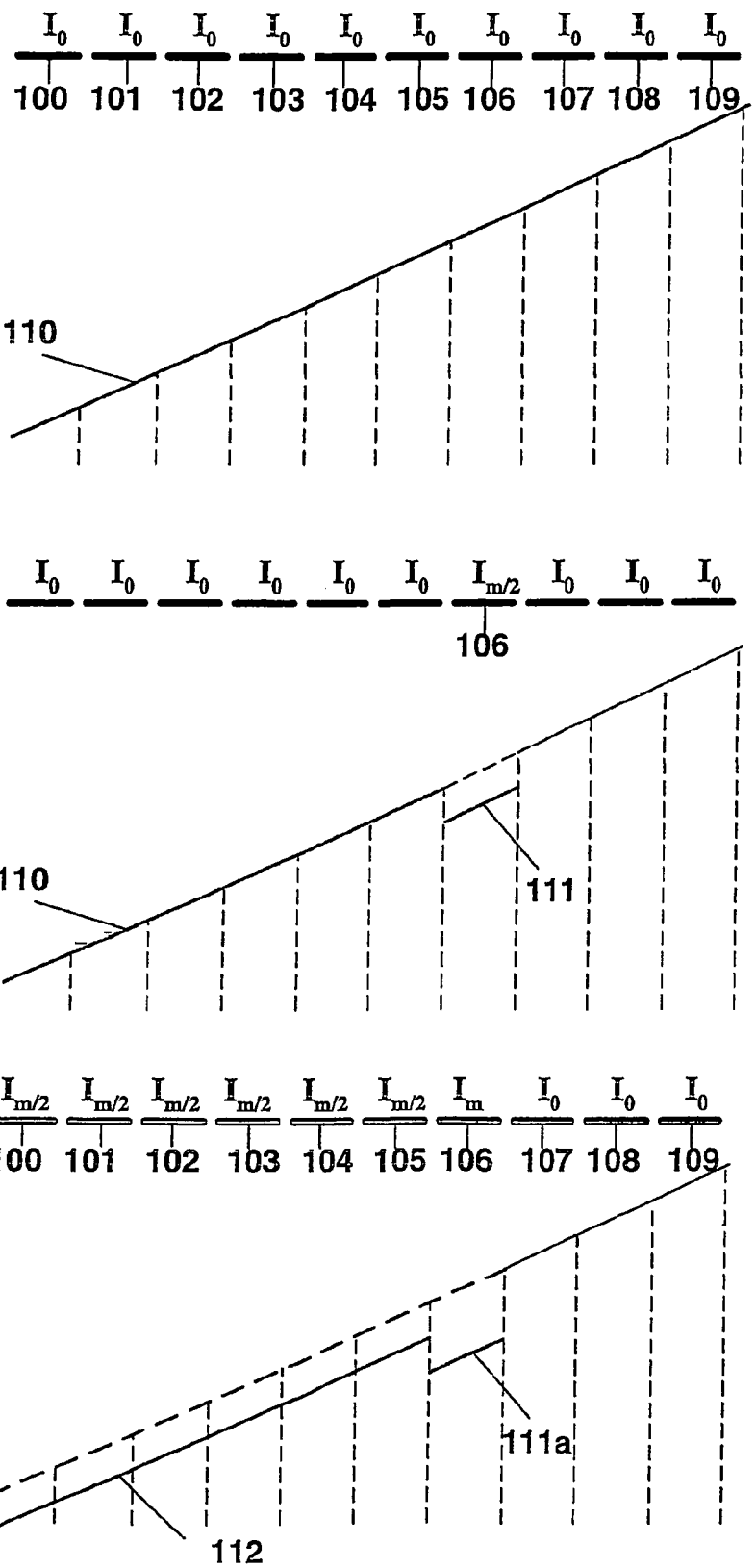
FIGS. 11 and 12 show chirp line drawings.

FIG. 11 illustrates how this can be put into effect. In FIG. 11 there is shown the chirp grating which acts as a mirror under three different conditions.

In the drawing there are shown ten electrode positions 100 to 109, which correspond to the electrode positions 65 to 72 in FIG. 10. In other words, instead of there being eight electrodes over the rear grating, there are ten electrode positions in this schematic. The line 110 corresponds to the line 96 of the grating as shown in FIG. 10. The vertical dotted lines show the alignments of the electrodes and the portions of the chirp diagram.

In the upper portion of the FIG. 11 there is no current flowing through any of the electrodes 100 to 109. The line 110 is continuous with no portion being preferred.

In the central portion of FIG. 11 a current is passed through electrode 106. The current being half that required to cause the maximum reduction in the refractive index of the material of the chirp grating below the electrode 106 which is equivalent to material 86 in FIG. 10. The result of this is to displace downwards the portion 111 of the line 110. This results in a selection of a particular wavelength at which the laser can lase in exactly the same manner as described above with reference to FIG. 10.

To further tune the laser, so as to reduce the wavelength at which lasing is preferred, current is passed through all of electrodes 100 to 105 and at the same time the current passing through electrode 106 is increased. This causes a lowering of the portion 112 of the chirp line below its original position, shown dotted. The portion 111a of the line 110 also is lowered at the same time, thus moving the point of selection to a lower wavelength. In best practice no additional current need be passed through electrodes 107 to 109, as they play no part in the reflecting process. However, since they play no part in the selection process, it is possible for the electrodes 107 to 109 to be lowered in amounts similar to electrodes 100 to 105 without interfering with the wavelength selectivity. When the current passing through the electrode 106 is the maximum which can be applied to reduce n, and thus the maximum amount of fine tuning has occurred, the electrodes 100 to 105 will be passing a current which corresponds to half of the total reduction of n in the material in section 62 below electrodes 100 to 105.

To further tune the laser, the current is removed from electrode 106 and is applied to the next adjacent electrode (or any other selected electrode) and the sequence of actions is repeated. By this means the laser can be tuned over the entire 1530 nm to 1570 nm waveband.

Figure 12:
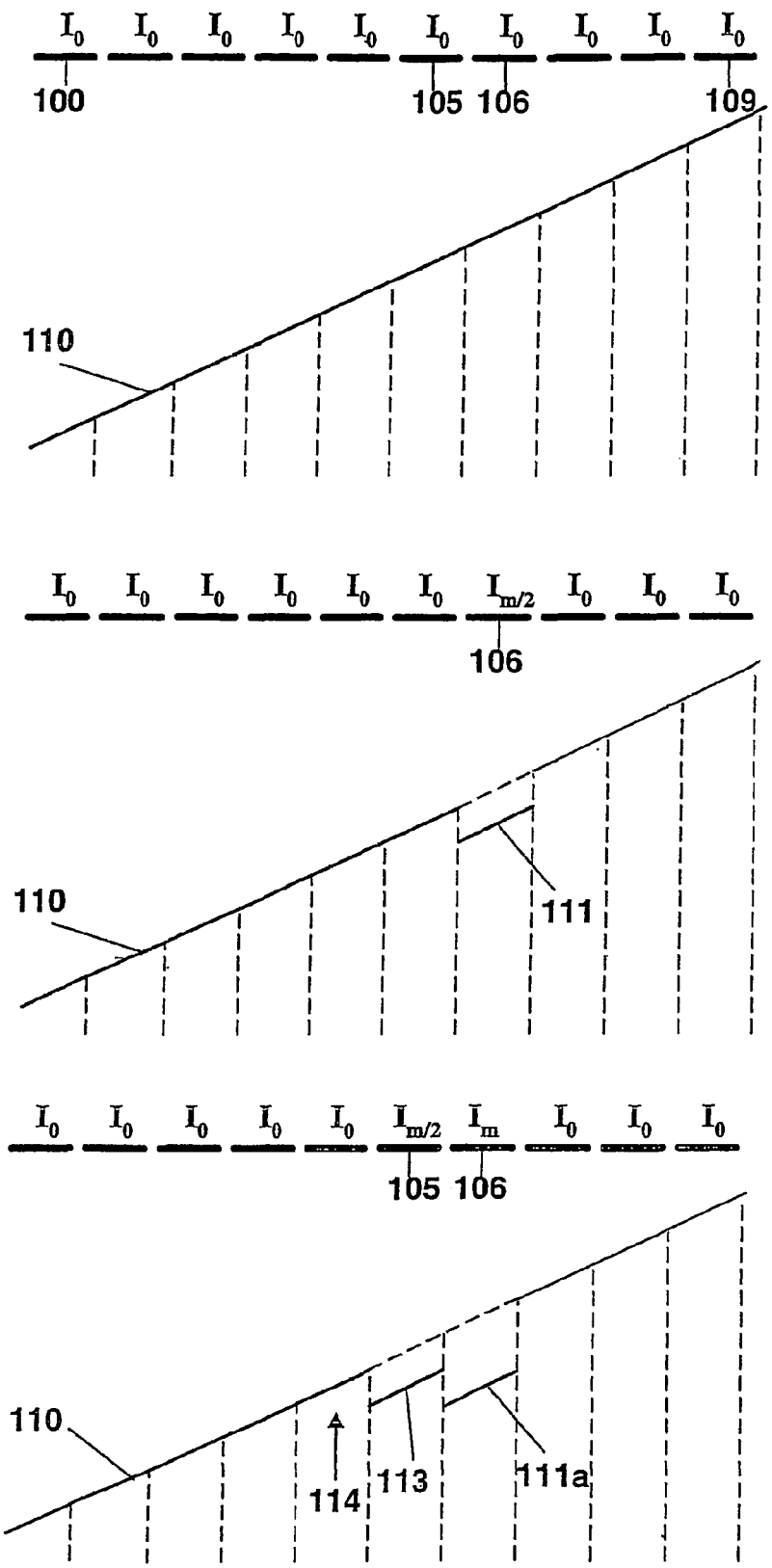

The selectivity of the chirp at a particular wavelength can be enhanced as shown schematically in FIG. 12. This figure is similar to FIG. 11 but shows what happens when two adjacent sections of the chirp grating are moved together.

In the upper portion of FIG. 12 the chirp grating is shown in the same position as in FIG. 11. This is also the case for the central portion of FIG. 12, where current applied to electrode 106 has caused a lowering of the line 111 to the position half way down to its maximum extent. If the current is passed through electrode 105 this causes the line 113 to be lowered and the current passing through electrode 106 is increased at the same rate so that lines 111a and 113 move down in synchronism. This means that the grating selectivity is increased by the enhanced reflectivity.

When the applied current to electrode 105 is half of that applied to electrode 106 and the line 111a is depressed to its maximum extent the lines 111a and 113 will also coincide with portion 114 of line 110 to give a three-region coincidence.

It will be appreciated that the more electrodes that can be installed over the chirp, the greater the number of regions that can be brought into coincidence and the smaller each reduction in n needed at any point to tune the laser. For a range of 40 nm total tuning, if say, twelve different electrode positions were used, then each would only be required to tune through a range of 4 nm to cover the entire band with a degree of wavelength margin at the band edges.

By this process, therefore, the laser can be tuned over the whole of the desired wavelength range, depending on the bandwidth of the original gratings.

During fine tuning the cavity length will vary and a phase change section 61 controllable by electrode 64 is used to give a constant optical cavity length.

In normal operation light output is coupled from the front of the laser adjacent to the gain section, and a small amount of light maybe taken from the rear of the laser adjacent the Bragg grating(s) for auxiliary purposes such as wavelength locking. However, nothing is meant to imply that implementations with light primarily coupled out of the rear of the laser are precluded from the scope of the invention.

The invention claimed is:

1. A tuneable laser, comprising a phase change section bounded on one side by a Bragg reflector and on the other side by a gain section, the Bragg reflector reflecting at a plurality of wavelengths and comprising at least first, second and third portions, each of which is arranged to have current pass selectively therethrough, thereby lowering a refractive index of said portions of the Bragg reflector, to tune the portions to reflect at a lower wavelength, wherein the first portion is arranged such that it is tuneable to reflect at a lower wavelength corresponding to a wavelength at which the second portion reflects, thereby producing a reinforced reflection, the first and second portions being tuneable such that the reinforced reflection produced by the first and second portions is capable of being tuned to lower wavelengths, including a wavelength at which the third portion reflects.

2. A tuneable laser as claimed in claim 1, wherein the Bragg reflector comprises a chirp grating formed in a material having a refractive index variable in response to the passage of current therethrough, and a plurality of external electrodes disposed along the length of the grating, wherein each of said plurality of electrodes are selectively connectable to a power source.

3. A tuneable laser according to claim 1, wherein the Bragg reflector comprises a plurality of discrete grating units, wherein at least two of said plurality of grating units have a different pitch.

4. A tuneable laser according to claim 3, wherein each of said plurality of grating units has a different pitch, such that the grating unit closest to the phase section has the shortest pitch, and wherein the pitch of each successive grating unit of said plurality of grating units extending away from the phase section is greater than the pitch of the preceding grating unit.

5. A tuneable laser according to claim 4, wherein each grating unit has an independently actuable electrode.

6. A tuneable laser according to claim 4, further comprising a switching circuit provided to switch the current to the electrodes.

7. A tuneable laser according to claim 1, further comprising a partial reflecting mirror coupled to said gain section.

8. A tuneable laser according to claim 1, wherein said Bragg reflector comprises a plurality of discrete grating units, each of said plurality of grating units having a different pitch, wherein said plurality of grating units are positioned so as to extend away from said phase section such that the grating unit adjacent the phase section has the shortest pitch, and wherein the pitch of each successive grating unit of said plurality of grating units is greater than the pitch of the immediately preceding grating unit.

9. A tuneable laser according to claim 1, wherein at least one of said phase change section, Bragg reflector and gain section is formed of a semiconductor material.

10. A tuneable laser according to claim 1, wherein the second portion is arranged such that it is tuneable to reflect at a lower wavelength corresponding to a wavelength at which the third portion reflects, thereby producing a reinforced reflection produced by the second and third portions, the second and third portions being tuneable such that their reinforced reflection is capable of being tuned to lower wavelengths.

11. A tuneable laser, comprising an active section, a phase section and a Bragg reflector, wherein said Bragg reflector includes at least first, second and third discrete grating units, each of which has a different pitch, and each of which is arranged to have current pass selectively therethrough, thereby lowering a refractive index of each grating unit such that an effective wavelength at which each grating unit reflects is tuned to a lower wavelength, wherein the first grating unit is arranged such that it is tuneable to reflect at a lower wavelength corresponding to a wavelength at which the second grating unit reflects, thereby producing a reinforced reflection, the first and second grating units being tuneable such that the reinforced reflection produced by the first and second grating units is capable of being tuned to lower wavelengths, including a wavelength at which the third grating unit reflects.

12. A tuneable laser according to claim 11, further comprising a partial reflecting mirror coupled to said active section.

13. A tuneable laser according to claim 11, wherein at least one of said active section, phase section, and Bragg reflector is formed of a semiconductor material.

14. A tuneable laser according to claim 13, wherein said semiconductor material is a Group III–V material.

15. A tuneable laser according to claim 11, manufactured using electron beam writing techniques.

16. A tuneable laser according to claim 11, manufactured using holographic phase grating plate.

17. A tuneable laser according to claim 11, wherein the grating unit has a length selected to produce a substantially uniform intensity gain response.

18. A tuneable laser according to claim 11, further comprising a Bragg grating coupled to said active section.

19. A tuneable laser according to claim 11, wherein the second grating unit is arranged such that it is tuneable to reflect at a lower wavelength corresponding to a wavelength at which the third grating unit reflects, thereby producing a reinforced reflection produced by the second and third grating units, the second and third grating units being tuneable such that their reinforced reflection is capable of being tuned to lower wavelengths.

* * * * *